(12) United States Patent
Yost et al.

(10) Patent No.: US 6,384,825 B2
(45) Date of Patent: *May 7, 2002

(54) METHOD OF CONTROLLING A SPARSE VECTOR RASTERIZER

(75) Inventors: Jeff W. Yost, Tigard; Paul M. Gerlach, Beaverton, both of OR (US)

(73) Assignee: Tektronix, Inc., Beaverton, OR (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/106,383

(22) Filed: Jun. 25, 1998

(51) Int. Cl.$^7$ .............................. G09G 5/36; G06K 9/40
(52) U.S. Cl. ..................................... 345/440.1; 382/267
(58) Field of Search ............................. 345/440, 440.1, 345/611, 673, 208, 16; 382/267; 324/121 R

(56) References Cited

U.S. PATENT DOCUMENTS

| | | | | |
|---|---|---|---|---|
| 4,743,844 A | * | 5/1988 | Odenheimer et al. ... | 324/121 R |
| 5,375,067 A | * | 12/1994 | Berchin ....................... | 702/66 |
| 5,898,420 A | * | 4/1999 | Timm ........................ | 345/134 |
| 6,104,374 A | | 8/2000 | Sullivan et al. | |

* cited by examiner

*Primary Examiner*—William A. Cuchlinski, Jr.
*Assistant Examiner*—Thu Nguyen
(74) *Attorney, Agent, or Firm*—John Smith-Hill; William K. Bucher

(57) ABSTRACT

A signal acquisition instrument acquires a succession of waveform records and sequentially transfers the waveform records to a rasterizer for rasterizing the waveform records to generate respective rasterized records each composed of a set of vectors, but inhibits transfer of a current waveform record to the rasterizer until a previous waveform record has been rasterized. The maximum number of dots (M) in each vector is made as large as possible provided that the rasterizer does not complete rasterization of the previous waveform record after acquisition of the current waveform record is complete.

19 Claims, 3 Drawing Sheets

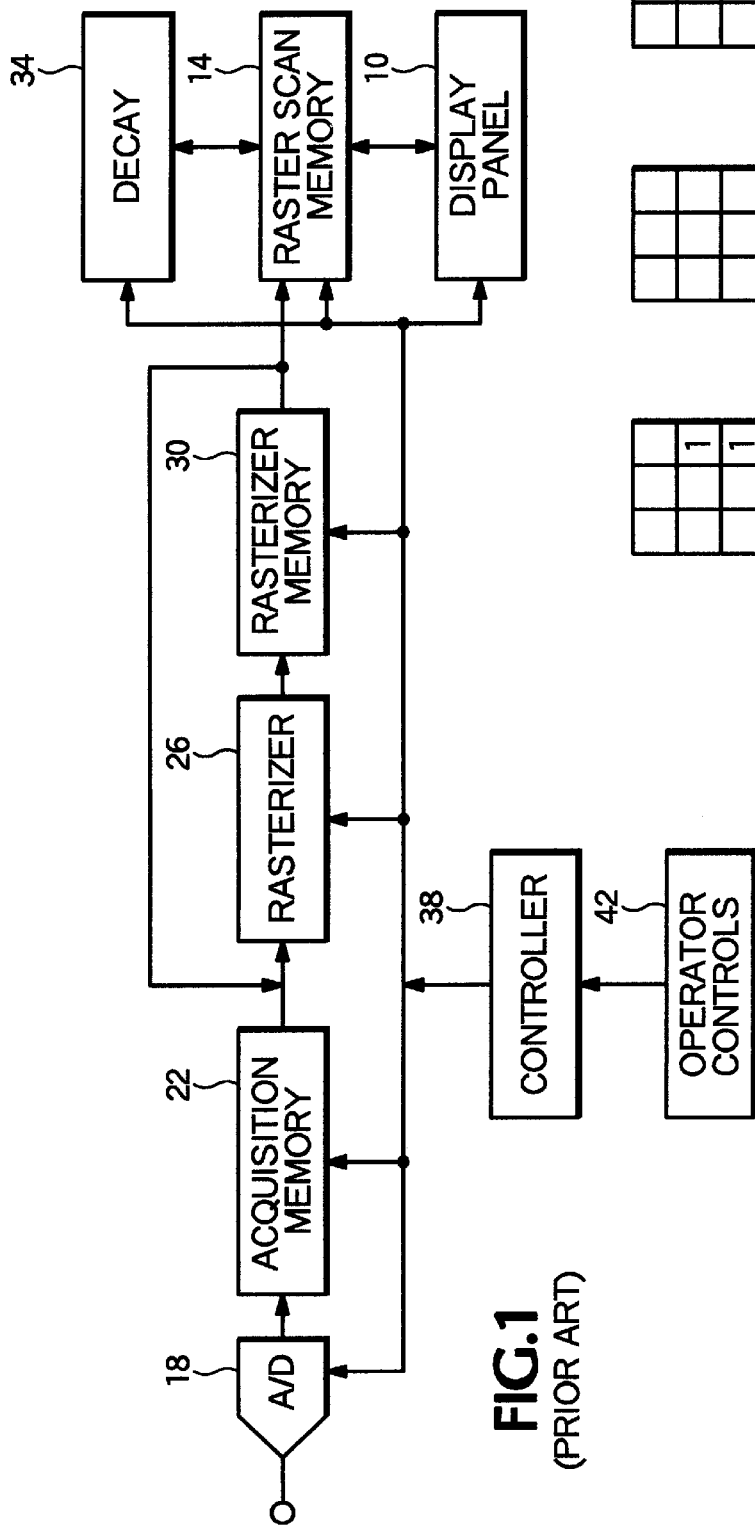
FIG. 1 (PRIOR ART)
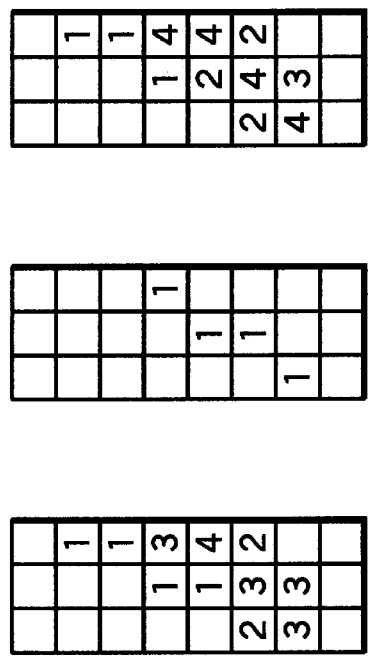
FIG. 2A (PRIOR ART)
FIG. 2B (PRIOR ART)
FIG. 2C (PRIOR ART)

US 6,384,825 B2

METHOD OF CONTROLLING A SPARSE VECTOR RASTERIZER

BACKGROUND OF THE INVENTION

This invention relates to a method of controlling a sparse vector rasterizer.

An oscilloscope presents the activity of an electrical signal to its user. Referring to FIG. 1, a conventional raster scan digital oscilloscope includes a display panel 10 having a two-dimensional array of pixels, with each pixel location being uniquely defined by a row number and a column number. The oscilloscope also includes a raster scan memory 14 having a two-dimensional address space. The memory locations in the raster scan memory map on a one-to-one basis with the pixel locations of the display panel 10. The state of each pixel depends on the contents of the corresponding memory location in the raster scan memory 14.

In the case of the oscilloscope shown in FIG. 1, the raster scan memory stores n bits of information for each pixel, where n is an integer greater than one, which allows each pixel to have $2^n$ illumination states. One of the states is off, and in the other $2^n-1$ states, the pixel is illuminated at different respective intensities. Thus, for example, a 4-bit deep raster scan memory can support fifteen levels of partial to maximum illumination (gray scale levels) as well as the dark or off state.

Depending on the nature of the signal and the settings of the oscilloscope, a given column of pixels may contain one or more illuminated pixels (hereinafter referred to as dots). Each column displays a vector, defined as the segment of the column between the uppermost dot in the column and the lowermost dot in the column. The vector has a length (in pixel units) equal to one plus the difference between the row numbers of the top and bottom dots in the column. Thus, if the column contains only one dot, the vector has a length of one unit.

The digital oscilloscope shown in FIG. 1 also includes an A/D converter 18 having an input terminal for acquiring an electrical signal at a test point in an electronic circuit. The A/D converter samples the signal during an acquisition interval and quantizes the samples to generate a sequence of digital data words. The data words generated by the A/D converter and having values D1-DN are stored as a linear waveform record in an acquisition memory 22 having a one-dimensional address space A1-AN.

When the acquisition is complete, the linear waveform record stored in the acquisition memory is supplied to a rasterizer 26 which generates a rasterized waveform record and stores it in a rasterizer memory 30 having a two-dimensional address space (X1-XN, Y1-YN). (The common suffix N is used for economy and is not intended to indicate that the number of elements in the set {Xi}, for example, is the same as the number of elements in the set {Ai}.) The X component of the address of a data word in the rasterized waveform record stored in the rasterizer memory 30 is derived from the address Ai of at least one word of the linear waveform record and the Y component of the address is derived from the value Di of at least one word of the linear waveform record.

Each combination of addresses (Xi, Yi) at which a data word is stored in the rasterizer memory 30 represents an event, characterized by a unique combination of time (dependent on Xi) and signal level (dependent on Yi).

The rasterized waveform record may be added to an existing display record stored in the raster scan memory 14 to control the state of the display panel 10. Referring to FIGS. 2A–2C, in which the numerical values designate units of intensity, FIG. 2A represents the original display record for three adjacent columns of the display panel prior to addition of the rasterized waveform record for a new acquisition, FIG. 2B represents the rasterized waveform record for the corresponding interval of the new acquisition, and FIG. 2C represents the updated display record obtained by adding the rasterized waveform record of FIG. 2B to the display record of FIG. 2A. Thus, if the same event occurs during multiple acquisitions, the value of the data word representing that event in the raster scan memory 14 increases.

As also shown in FIG. 1, the contents of the raster scan memory may be influenced by a decay process 34, which reduces the value stored at each location in the raster scan memory by a selected amount per unit time, so that events that occur only infrequently will be shown with reduced intensity as compared with events that occur more frequently.

The oscilloscope includes a controller 38, which controls operation of the other components shown in FIG. 1, and operator controls 42 which allow the user to adjust the settings of the oscilloscope. The controller 38 is implemented as a state machine, which advances from one state to another in accordance with a stored program and in dependence on inputs received by the state machine.

In one known technique of rasterizing, referred to as the dot mode, the address (Xi, Yi) of a data word of the rasterized waveform record is derived from a single data-address pair of the linear waveform record. Thus, the data words in the rasterized waveform record correspond on a one-to-one basis with the data-address pairs of the linear waveform record.

It is generally considered desirable that the waveform presented to the user of an oscilloscope be substantially continuous, without significant horizontal or vertical gaps between dots. However, when the rasterizer operates in the dot mode, there may be gaps between dots in the display. Accordingly, depending on the signal and the settings of the oscilloscope, the dot mode of rasterizing may not be considered optimum.

In another known mode, referred to as the full vector mode, the rasterized waveform record includes not only data words derived respectively from the data-address pairs of the linear waveform record but also additional data words which are synthesized by the rasterizer to ensure that the waveform is continuous, so that an end point of a vector is offset vertically from the end point of an adjacent vector by no more than one pixel, and all the pixels between the two end points of the vector, as well as the two end points themselves, are illuminated.

The advantage of full vector mode rasterization is also a disadvantage: since there are no gaps in a vector created by the rasterizer, rasterization may require many memory accesses, delaying completion of rasterization.

U.S. Pat. No. 6,104,374, the entire disclosure of which is hereby incorporated by reference herein, discloses a sparse vector mode of rasterizing in which the end points of a vector may be vertically offset from an adjacent vector by more than one pixel and there may be a gap of one or more pixels between two dots in a given vector. Randomization is built into the sparse vector mode, so that even if the linear waveform records for successive acquisitions are identical, the respective arrays of dots will generally not be precisely the same, and gaps in a vector created on one acquisition will be filled in on a subsequent acquisition. An advantage of the sparse vector mode is that it reduces the number of dots that are generated during rasterizing of an acquisition and therefore reduces the time taken to rasterize the acquisition.

One of the variables used in processing the linear waveform record to generate the rasterized waveform record in sparse vector rasterization is the maximum number of dots per vector. The quality of the display increases as the maximum number of dots per vector increases, because with more dots per vector, there are smaller gaps between adjacent dots in a vector. In a practical implementation of the oscilloscope shown in FIG. 1, the maximum number of dots $D_{max}$ is specified by the variable M, where $D_{max}$ is equal to $2^M$. In this practical implementation, there are 500 pixels in each column and the maximum value of M is 9, so that $D_{max}$ exceeds 500 and it is therefore possible to display a full height vector in full vector mode.

In the sparse vector mode, the actual number of dots per vector may be less than the $D_{max}$. Generally, as the actual number of dots per vector increases, the time taken to process the linear waveform record to generate the rasterized waveform record increases and conversely, as the actual number of dots per vector decreases, the time taken to process the linear waveform record decreases.

Regardless of the mode of rasterization, the oscilloscope operates in a succession of cycles. At the start of each cycle, the acquisition memory is available to receive a linear waveform record for a new acquisition. During a given cycle, the acquisition memory 22 stores the linear waveform record for the current acquisition (acquisition n) and the rasterizer memory 30 stores the latest completed acquisition (acquisition n−1) while it is being rasterized. When acquisition n−1 has been rasterized, the rasterized waveform record for acquisition n−1 can be supplied to the raster scan memory 14 and the linear waveform record for acquisition n can then be supplied to the rasterizer. The next cycle, in which the linear waveform record for acquisition n+1 is stored in the acquisition memory, cannot start until the linear waveform record for acquisition n has been supplied to the rasterizer 26, and the linear waveform record for acquisition n cannot be supplied to the rasterizer 26 until the rasterized waveform record for acquisition n−1 has been supplied to the raster scan memory 14.

In order to convey the maximum information to the user of an oscilloscope, it is necessary to maximize the acquisition rate, i.e. the number of acquisitions completed per unit time. Since a new acquisition cannot be started until the previous acquisition has been rasterized and has been supplied to the raster scan memory 14, it would be desirable to be able to adjust the rasterization time so that it does not delay start of the next acquisition. In order to provide a high quality display, it would be desirable to maximize the number of dots per vector.

SUMMARY OF THE INVENTION

In accordance with a first aspect of the invention there is provided an improved method of operating a signal acquisition instrument of the kind that acquires a succession of waveform records and sequentially transfers the waveform records to a rasterizer for rasterizing the waveform records to generate respective rasterized records each composed of a set of vectors, each vector being expressed by a selected maximum number of dots (M) greater than a minimum value $M_{min}$, wherein the instrument inhibits transfer of a current waveform record to the rasterizer until a previous waveform record has been rasterized, and the improvement comprises making M as large as possible provided that the rasterizer does not complete rasterization of the previous waveform record after acquisition of the current waveform record is complete.

In accordance with a second aspect of the invention there is provided an improved method of operating a signal acquisition instrument of the kind that executes a succession of cycles, in each of which the instrument acquires a current waveform record and rasterizes a previous waveform record to generate a rasterized record composed of a set of vectors, each vector being expressed by a selected maximum number of dots (M) greater than a minimum value $M_{min}$, and the cycle is not complete until acquisition of the current waveform record is complete and rasterization of the previous waveform record is complete, and the improvement comprises (a) choosing a variable representative of whether completion of a given cycle is being delayed by rasterization of the previous waveform record of the given cycle, wherein an increase in the value of the variable is associated with a increase in acquisition rate, (b) in a first cycle of operation, calculating the value of said variable, (c) if said value exceeds a threshold value, increasing M for a second cycle of operation, and (d) in the second cycle of operation, calculating the value of said variable and determining whether the value of said variable exceeds said threshold value.

In accordance with a third aspect of the invention there is provided a signal acquisition instrument of the kind that acquires a succession of waveform records and sequentially transfers the waveform records to a rasterizer for rasterizing the waveform records to generate respective rasterized records each composed of a set of vectors, each vector being expressed by a selected maximum number of dots (M) greater than a minimum value $M_{min}$, wherein the instrument inhibits transfer of a current waveform record to the rasterizer until the previous waveform record has been rasterized, the signal acquisition instrument including a controller programmed to make M as large as possible provided that the rasterizer does not complete rasterization of the previous waveform record after acquisition of the current waveform record is complete.

In accordance with a fourth aspect of the invention there is provided a signal acquisition instrument of the kind that executes a succession of cycles, in each of which the instrument acquires a current waveform record and rasterizes a previous waveform record to generate a rasterized record composed of a set of vectors, each vector being expressed by a selected maximum number of dots (M) greater than a minimum value $M_{min}$, and the cycle is not complete until acquisition of the current waveform record is complete and rasterization of the previous waveform record is complete, wherein the instrument includes a controller and the improvement comprises a controller programmed to choose the variable representative of whether completion of a given cycle is being delayed by rasterization of the previous waveform record of the given cycle, wherein an increase in the value of the variable is associated with a reduction in acquisition rate; in a first cycle of operation, calculate the value of said variable; if said value exceeds a threshold value, increase M for a second cycle of operation; and in the second cycle of operation, calculate the value of said variable and determine whether the value of said variable exceeds said threshold value.

BRIEF DESCRIPTION OF THE DRAWINGS

For a better understanding of the invention, and to show how the same may be carried into effect, reference will now be made, by way of example, to the accompanying drawings, in which FIG. 1 is a block diagram illustrating some features of a digital oscilloscope in accordance with the prior art, FIG. 2 illustrates operation of the oscilloscope shown in FIG. 1.

The arrangement of blocks shown in FIG. 1 has been selected to facilitate description of signal flow and does not necessarily correspond with the arrangement of blocks in a practical implementation of the oscilloscope.

DETAILED DESCRIPTION

The functional components of an oscilloscope in accordance with the invention are the same as those illustrated in FIG. 1. However, the controller operates the rasterizer in accordance with the algorithm illustrated by the flow chart shown in FIG. 3 or the state diagram shown in FIG. 4.

Figure 3:
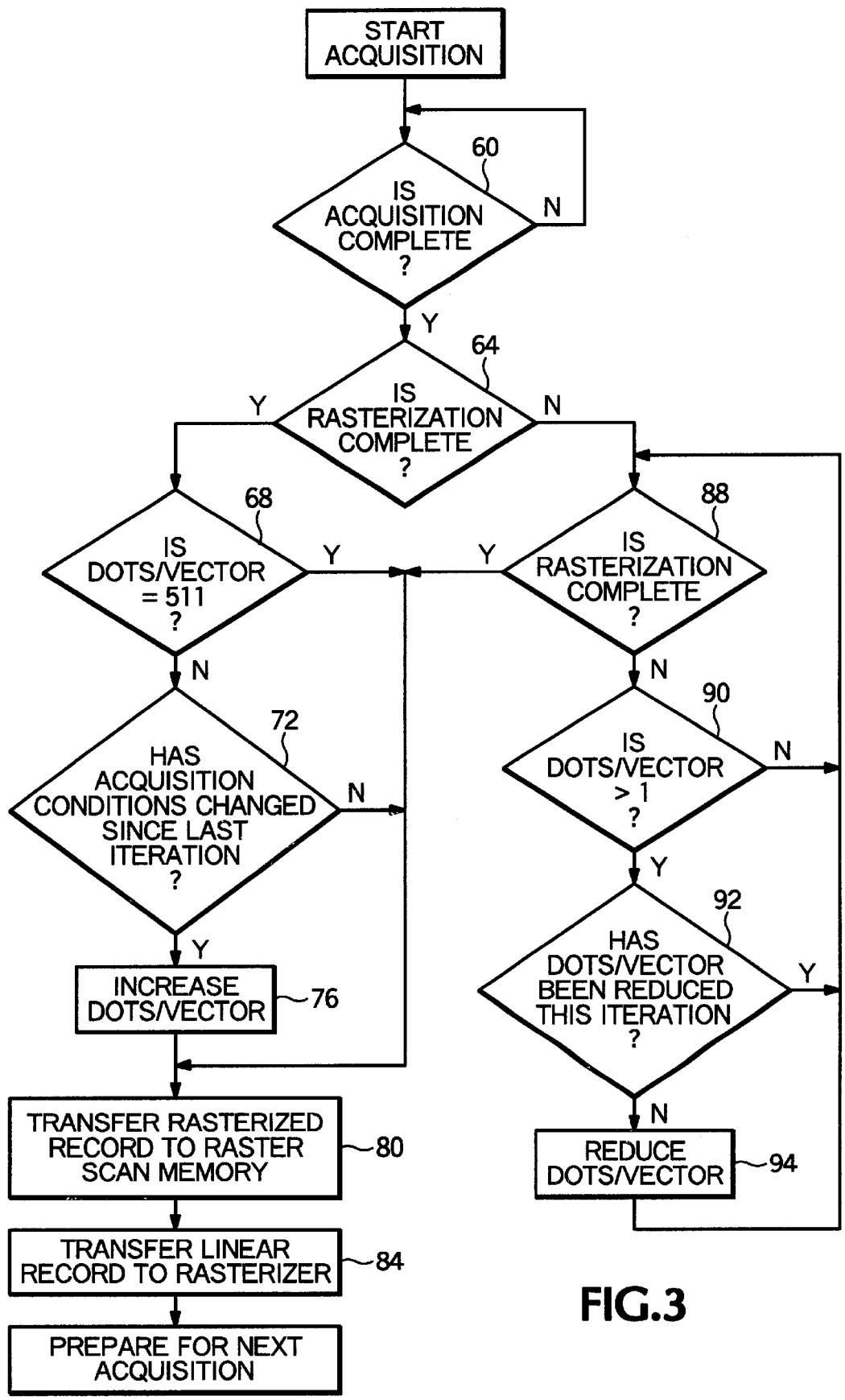
FIG. 3 is a flow chart illustrating a method in accordance with the present invention.

FIG. 3 illustrates the steps in a first method in accordance with the invention. As shown in FIG. 3, during an operating cycle the controller 38 tests whether the current acquisition (acquisition n) is complete (step 60) and, if so, tests whether the rasterizer has completed rasterization of acquisition n−1 (step 64). If the rasterizer has completed rasterization of acquisition n−1, and therefore is not limiting acquisition, the process advances to an increment loop whereas if the rasterizer has not completed rasterization of acquisition n−1, and therefore is limiting the acquisition rate, the process passes to a decrement loop. In the increment loop, the controller tests whether $D_{max}$ is already at its maximum value (511 in the example) (step 68) and, if not, tests whether acquisition conditions have changed since the last iteration of the process (step 72). The types of conditions that might be relevant will be discussed below. If conditions have changed, there is a possibility of increasing the quality of the display without causing the rasterizer to limit the acquisition rate, and so the controller increases $D_{max}$ (step 76). The controller transfers the rasterized record for waveform n−1 to the raster scan memory (step 80) and transfers the linear waveform record for acquisition n to the rasterizer (step 84).

In the decrement loop, the controller again tests whether rasterization is complete (step 88) and, if not, whether $D_{max}$ is already at its minimum value (one in the case of this implementation) (step 90) and, if so, returns to step 88. If $D_{max}$ is greater than its minimum value, the controller tests whether $D_{max}$ has previously been reduced during this operating cycle (step 92) and, if so, returns to step 88. If $D_{max}$ has not previously been reduced, the controller sets $D_{max}$ for rasterization of acquisition n, in the next operating cycle, to a value smaller than its value for rasterization of acquisition n−1 (step 94) in order to speed up the rasterization and then returns to step 88. When the rasterization of acquisition n−1 is complete, the process passes to step 80. It will be appreciated that if the process passes from step 88 to step 80 without passing through step 90, the rasterization is not limiting the acquisition rate.

The value of $D_{max}$ is changed by incrementing or decrementing M, usually in steps of one. It is possible in some circumstances that the actual number of dots per vector will be substantially less than $D_{max}$. In this case, reducing M by one might not reduce the actual number of dots per vector, and multiple iterations of the process shown in FIG. 3 might be necessary in order to prevent the rasterizer from limiting the acquisition rate. Therefore, in the decrement loop, it may be desirable to test whether the actual number of dots per vector is significantly less than $D_{max}$ and, if so, reduce M in step 94 by a sufficient amount to reduce the actual number of dots per vector.

The determination of whether the rasterizer is limiting the acquisition rate may be made independently of the acquisition rate and asynchronously with the acquisition and rasterization operations. Specifically, the determination may be made at a constant rate which is independent of the acquisition rate and is substantially lower than a typical acquisition rate.

Figure 4:
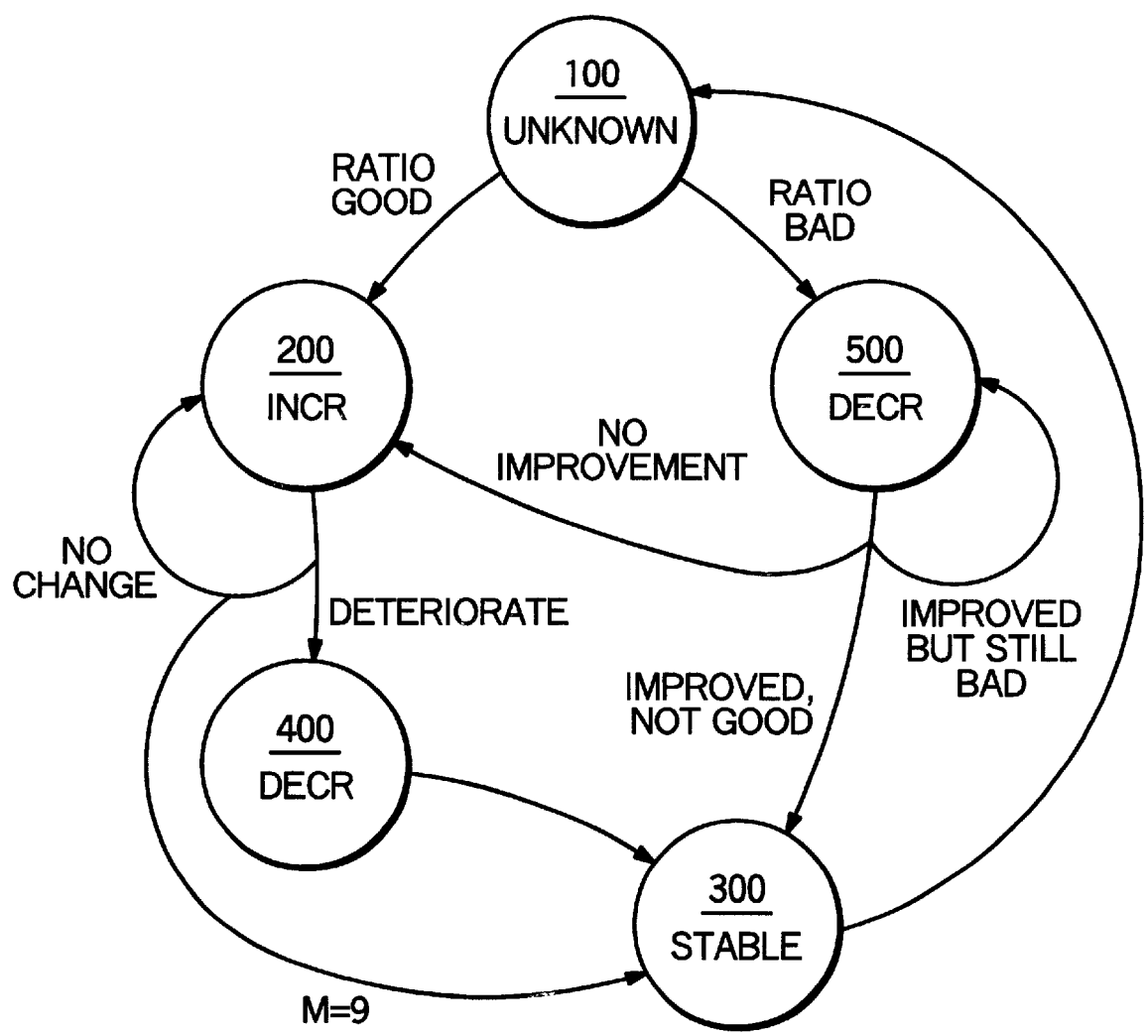
FIG. 4 is a state diagram illustrating an algorithm for control of an oscilloscope by another method in accordance with the present invention.

FIG. 4 illustrates a procedure for optimizing the number of dots per vector in the event that it is not possible to determine directly whether the rasterizer is limiting the acquisition rate.

In the initial state 100, labeled unknown, the actual acquisition rate $R_{act}$ currently being achieved with a given instrument set up is compared to a maximum acquisition rate $R_{max}$ by comparing the ratio $R_{act}/R_{max}$ to a predetermined threshold value. If the ratio exceeds the threshold value, the possibility exists of increasing the number of dots per vector without adversely affecting the actual acquisition rate, and accordingly the machine changes to state 200, in which M is incremented unless M is already equal to 9. Alternatively, if M is equal to zero, the machine changes to state 200. The ratio is again compared with the threshold value. If the ratio after incrementing is not significantly different from its value before incrementing and M is less than 9, the machine returns to state 200, in which M is incremented again. If there was no significant change in the ratio but the value of M after incrementing is equal to 9, the machine changes to state 300. If, when M was incremented, the ratio changed for the worse, the machine changes to state 400, in which the value of M is decremented and the machine then changes to state 300.

If the ratio in state 100 was less than the threshold value, indicating that the acquisition rate is significantly lower than the maximum possible and that it should be possible to increase the acquisition rate by reducing the number of dots per vector, the machine changes to state 500, in which the value of M is decremented. If the ratio increased and is now above the threshold value or if M is equal to zero, the machine changes to state 300. If the ratio increased but is still below the threshold and M is not equal to zero, the machine returns to state 500 and M is decremented once more. If the ratio did not increase and M is greater than zero and less than 7, the machine passes to state 200, in which the value of M is incremented.

The machine is held in state 300 for a selected time, which is typically long enough to complete several acquisitions. If after the selected time, conditions change such that the acquisition rate might decrease, the machine returns to state 100 so that it can again be determined whether the value of $D_{max}$ is optimum. A change in conditions that might cause the acquisition rate to decrease include a change in the vertical content of the signal or change in the front panel settings of the oscilloscope, for example the time/div setting. A change in the vertical content of the signal, particularly an increase in the peak-to-peak amplitude of the signal, might adversely affect the acquisition rate because, in general, it takes longer to update the raster scan memory with a rasterized waveform record if the vectors of the rasterized waveform record are longer than if they are shorter. Thus, referring to FIG. 2A, it takes longer to update the raster scan memory with the vector in the middle column having four dots than with the vector in the left column having only two dots because it requires more memory accesses. Therefore, an increase in the vertical content may result in a delay in the rasterizer being available to receive the linear waveform record from the acquisition memory.

Another condition that might cause the acquisition rate to decrease is a change in the front panel settings of the oscilloscope. For example, a change in the time/div setting could result in a change in the acquisition time which could change the time available for rasterization. Also, a change in signal content may affect the raster rate (the reciprocal of the time taken to load the raster scan memory with the rasterized waveform record) which may change the time available for rasterization.

Further, in the event that the acquisition rate in fact changes, the machine passes from state 300 to state 100 in order to determine whether the value of $D_{max}$ is optimum at the new acquisition rate.

The maximum acquisition rate $R_{max}$ that is used to calculate the ratio to determine whether the rasterizer might be limiting the acquisition rate may be determined empirically for a given set up of the oscilloscope, such as the number of channels and the time per division setting. The maximum acquisition rate may be from a few per second to a few thousand per second.

The determination of whether the ratio $R_{act}/R_{max}$ exceeds the threshold value may be made independently of the acquisition rate and asynchronously with the acquisition and rasterization operations. Specifically, the determination may be made at a constant rate which is independent of the acquisition rate and is substantially lower than a typical acquisition rate.

An acquisition is initiated in response to a trigger, which normally occurs when the signal level passes through a selected level in a selected direction. Often the trigger rate will be higher than the acquisition rate, so not every trigger initiates an acquisition. If, however, the trigger rate is low, so that every trigger initiates an acquisition, the trigger rate, rather than the maximum acquisition rate $R_{max}$, is used to calculate the ratio that is compared with the threshold value in state 100.

In a practical implementation of the method described with reference to FIG. 4, a change in $D_{max}$ takes place immediately when the decision has been made that a change is required, and without waiting for the next rasterization to start. In other implementations, however, changes in the value of $D_{max}$ may be synchronized with the rasterizer, so that the rasterization in which the decision to change $D_{max}$ has been made is completed before the change takes place.

It will be appreciated that the invention is not restricted to the particular embodiment that has been described, and that variations may be made therein without departing from the scope of the invention as defined in the appended claims and equivalents thereof.

What is claimed is:

1. An improved method of operating a signal acquisition instrument of the kind that acquires a succession of waveform records and sequentially transfers the waveform records to a rasterizer for rasterizing the waveform records to generate respective sparse vector mode rasterized records each composed of a set of vectors, each vector being expressed by a magnitude length and a selected maximum number of dots (M) greater than a minimum value $M_{min}$, wherein the instrument inhibits transfer of a current waveform record to the rasterizer until a previous waveform record has been rasterized, and the improvement comprises:

making M as large as possible without adjusting the length of the magnitude vectors provided that the rasterizer does not complete the sparse vector mode rasterization of the previous waveform record after acquisition of the current waveform record is complete.

2. A method according to claim 1, comprising:

determining whether acquisition of said current waveform record has been completed before said previous waveform record has been rasterized and, if so, reducing M unless M is equal to $M_{min}$ and, otherwise, increasing M unless M is equal to a maximum value.

3. A method according to claim 1, comprising testing whether acquisition of said current waveform record has been completed before said previous waveform record has been rasterized at a frequency that is independent of acquisition rate.

4. A method according to claim 1, comprising testing whether acquisition of said current waveform record has been completed before said previous waveform record has been rasterized at a frequency that is lower than acquisition rate.

5. An improved method of operating a signal acquisition instrument of the kind that executes a succession of cycles, in each of which the instrument acquires a current waveform record and rasterizes a previous waveform record to generate a sparse vector mode rasterized record composed of a set of vectors, each vector being expressed by a magnitude length and a selected maximum number of dots (M) greater than a minimum value $M_{min}$, and the cycle is not complete until acquisition of the current waveform record is complete and rasterization of the previous waveform record is complete, and the improvement comprises:

(a) choosing a variable representative of whether completion of a given cycle is being delayed by the sparse vector mode rasterization of the previous waveform record of the given cycle, wherein an increase in the value of the variable is associated with an increase in acquisition rate, (b) in a first cycle of operation, calculating the value of said, (c) if said value exceeds a threshold value, increasing M for a second cycle of operation without adjusting the length of the magnitude vectors, and (d) in the second cycle of operation, calculating the value of said variable and determining whether the value of said variable exceeds said threshold value.

6. A method according to claim 5, wherein if the value calculated in step (b) does not exceed the threshold value, step (c) includes decreasing M for the second cycle of operation.

7. A method according to claim 6, wherein if the value calculated in step (d) is greater than the value calculated in step (b) but does not exceed the threshold value, the method further comprises decreasing M for a third cycle of operation.

8. A method according to claim 6, wherein if the value calculated in step (d) is substantially the same as the value calculated in step (b), the method further comprises increasing M for a third cycle of operation.

9. A method according to claim 6, wherein if the value calculated in step (d) exceeds the threshold value, the method further comprises maintaining M constant for a third cycle of operation.

10. A method according to claim 5, wherein if the value calculated in step (d) is substantially the same as the value calculated in step (b), the method further comprises increasing M for a third cycle of operation.

11. A method according to claim 5, wherein if the value calculated in step (d) is less than the value calculated in step (b), the method further comprises decreasing M for a third cycle of operation and maintaining M constant for a fourth cycle of operation.

12. A method according to claim 5, wherein if the value of M is its maximum, the method further comprises maintaining M constant for a third cycle of operation.

13. A method according to claim 5, wherein the variable is a ratio of the actual acquisition rate to a maximum acquisition rate.

14. A signal acquisition instrument of the kind that acquires a succession of waveform records and sequentially transfers the waveform records to a rasterizer for rasterizing the waveform records to generate respective sparse vector mode rasterized records each composed of a set of vectors, each vector being expressed by a magnitude length and a selected maximum number of dots (M) greater than a minimum value $M_{min}$, wherein the instrument inhibits transfer of a current waveform record to the rasterizer until the previous waveform record has been rasterized, the signal acquisition instrument including a controller programmed to make M as large as possible without adjusting the length of the magnitude vectors provided that the rasterizer does not complete the sparse vector mode rasterization of the previous waveform record after acquisition of the current waveform record is complete.

15. An instrument according to claim 14, wherein the controller is programmed to determine whether acquisition of said current waveform record has been completed before said previous waveform record has been rasterized and, if so, reducing M unless M is equal to $M_{min}$.

16. An instrument according to claim 14, wherein the controller is programmed to determine whether acquisition of said current waveform record has been completed before said previous waveform record has been rasterized and, if so, reduce M unless M is equal to $M_{min}$ and, otherwise, increase M unless M is equal to a maximum value.

17. An instrument according to claim 14, wherein the controller is programmed to test whether acquisition of said current waveform record has been completed before said previous waveform record has been rasterized at a frequency that is independent of acquisition rate.

18. An instrument according to claim 14, wherein the controller is programmed to test whether acquisition of said current waveform record has been completed before said previous waveform record has been rasterized at a frequency that is lower than acquisition rate.

19. A signal acquisition instrument of the kind that executes a succession of cycles, in each of which the instrument acquires a current waveform record and rasterizes a previous waveform record to generate a rasterized record composed of a set of vectors, each vector being expressed by a selected maximum number of dots (M) greater than a minimum value $M_{min}$, and the cycle is not complete until acquisition of the current waveform record is complete and rasterization of the previous waveform record is complete, wherein the instrument includes a controller for and the improvement comprises a controller programmed to choose a variable representative of whether completion of a given cycle is being delayed by rasterization of the previous waveform record of the given cycle, wherein an increase in the value of the variable is associated with a reduction in acquisition rate; in a first cycle of operation, calculate the value of said variable; if said value exceeds a threshold value, increase M for a second cycle of operation; and in the second cycle of operation, calculate the value of said variable and determine whether the value of said variable exceeds said threshold value.

* * * * *